(12) United States Patent
Lewis

(10) Patent No.: US 12,374,529 B2
(45) Date of Patent: Jul. 29, 2025

(54) COMPACT REMOTE PLASMA SOURCE FOR HDP CVD CHAMBERS

(71) Applicant: Advanced Refurbishment Technologies LLC, Austin, TX (US)

(72) Inventor: Christopher William Lewis, Austin, TX (US)

(73) Assignee: Advanced Refurbishment Technologies LLC, Austin, TX (US)

( * ) Notice: Subject to any disclaimer, the term of this patent is extended or adjusted under 35 U.S.C. 154(b) by 152 days.

(21) Appl. No.: 18/244,112

(22) Filed: Sep. 8, 2023

(65) Prior Publication Data
US 2024/0087852 A1 Mar. 14, 2024

Related U.S. Application Data

(60) Provisional application No. 63/404,829, filed on Sep. 8, 2022.

(51) Int. Cl.
*H01J 37/32* (2006.01)

(52) U.S. Cl.
CPC ..... *H01J 37/32357* (2013.01); *H01J 37/3211* (2013.01); *H01J 37/32183* (2013.01); *H01J 37/32862* (2013.01); *H01J 2237/002* (2013.01); *H01J 2237/3321* (2013.01)

(58) Field of Classification Search
CPC ............ H01J 37/32357; H01J 37/3211; H01J 37/32183; H01J 37/32862; H01J 2237/002; H01J 2237/3321
See application file for complete search history.

(56) References Cited

U.S. PATENT DOCUMENTS

| | | | | |
|---|---|---|---|---|
| 9,378,929 B2* | 6/2016 | Maeda | ............... | H01L 21/67017 |
| 2008/0122367 A1* | 5/2008 | Vinogradov | ............. | H05H 1/46 |
| | | | | 315/111.21 |
| 2016/0086772 A1* | 3/2016 | Khaja | .................. | H01J 37/3211 |
| | | | | 315/111.21 |
| 2018/0358206 A1* | 12/2018 | Ma | ............................ | B08B 5/00 |
| 2024/0087852 A1* | 3/2024 | Lewis | ............... | H01J 37/32357 |

* cited by examiner

*Primary Examiner* — Adam D Houston
(74) *Attorney, Agent, or Firm* — DUBOIS, BRYANT & Campbell, LLP; William D. Wiese

(57) ABSTRACT

This disclosure relates to systems and apparatuses for the cleaning of HDP chambers, and more specifically, for remote plasma source ("RPS") systems used for the generation and delivery of cleaning radicals to the interior of such chambers for the purposes of reacting with and removing materials deposited therein during the chambers' normal operation, wherein the plasma source and the power supply of the RPS system are decoupled from one another, the form factor of the plasma source is such that it may be mounted in immediate proximity to the target chamber, and wherein the plasma source uses variable capacitors in order to tune the RF signals it generates to the impedance of the conductive coil, such as may be due to changes in gas pressures inside of the system, so that the RF load in the coil may be balanced in near-real time.

20 Claims, 7 Drawing Sheets

COMPACT REMOTE PLASMA SOURCE FOR HDP CVD CHAMBERS

PRIORITY STATEMENT UNDER 35 U.S.C. § 119 & 37 C.F.R. § 1.78

This non-provisional application claims priority based upon prior U.S. Provisional Patent Application Ser. No. 63/404,829 filed Sep. 8, 2022, in the name of Christopher William Lewis, entitled "13.56 MHZ REMOTE PLASMA CLEAN HDP CHAMBERS," the disclosures of which are incorporated herein in their entirety by reference as if fully set forth herein.

BACKGROUND OF THE INVENTION 200 mm Speed chambers, such as Lam Research or Novellus Speed high density plasma ("HDP") chemical vapor deposition ("CVD") chambers, are utilized for a Silane-based process for gap-fill deposition. The vast majority of these chambers need to be cleaned periodically in order to remove the solid materials inadvertently deposited on their inner walls during the process of depositing these same materials on product wafers. A process for cleaning these chambers using plasma has been found to be successful for this purpose. This plasma cleaning process uses radio frequency ("RF") energy applied to the chamber's dome inductor assembly at about 4500 watts to homolytically dissociate $NF_3$ that has been pumped into the chamber to produce radical fluorine, known as F'. F' will combine with silicon-containing compounds such as silicon oxide or silicon nitride deposited on the inner walls of the chamber to form gaseous volatile byproducts (e.g., $SiF_4$, HF, $F_2$, $N_2$, $O_2$) that can be removed from the chamber via vacuum pump or other known scrubbing methods.

The inherently inefficient destruction of $NF_3$ from the current system architecture causes large amounts of $NF_3$, a greenhouse gas, to be released first into facilities and thence to the ambient atmosphere. In addition, this inefficient power delivery requires a large amount of RF energy for destructing $NF_3$, or other precursor gasses, resulting in high temperatures and RF voltages which can cause physical damage to the dome's ceramic material, and may result in formation of aluminum fluoride ($AlF_x$) inside of the chamber. This aluminum fluoride particulation necessitates frequent opening and manual cleaning of the chamber. Manual cleaning of the chamber results in tool downtime and may be hazardous to personnel or equipment as byproducts of the processes that occur in the chamber may be toxic.

The currently used cleaning method is very slow to clean the approximately 120,000-180,000 Angstroms of deposition material in the chamber and may include as many as three different pressure and flow regimes to clean the different areas within the chamber.

Additionally, the further the cleaning gasses must travel from the remote plasma source ("RPS") before they dissipate, recombine, are lost to gas phase, or react with container surfaces, before they react with the material deposited inside of the chamber, the less effective at cleaning they are going to be. Accordingly, it may be beneficial for the RPS to be situated as close as possible to the chamber to improve the cleaning performance of the radicals being generated by the RPS on their way to the chamber.

Many commercially available RPS systems combine the power supply and the plasma source in one contained box. However, these assemblies become too large to be placed in close proximity to the chamber body, making these remote plasma generators inefficient in delivering radicalized cleaning gases, such as F', to the interior of the chamber.

A further issue with the current state of the art for cleaning these chambers using such traditional RPS systems include their inability to operate efficiently across a range of gas pressures. As the pressure of the gas inside of the RPS system affects the inductance of the conductive coil that the RPS system uses to generate the plasma that destructs the input gas, forming the radicalized gases used to clean the chamber. Such a change of coil inductance can unbalance the RF load in the coil resulting in a reduction of the system's ability to efficiently destruct the input gas (e.g., $NF_3$) to form radicalized cleaning gasses (e.g., F').

The limited ranges of pressure at which current RPS systems may effectively operate result in associated limitations in their ability to perform their cleaning functions, including but not limited to the requirement to spin-down any turbomolecular pumps ("turbo(s)") such that radicalized gases may be passed through the turbos, cleaning their blades and walls. Historically, this must be done with the turbos spun-down to zero RPM and while being pressure-controlled from roughing pumps because the 13.56 MHz $NF_3$ and argon plasma could not be sustained at process pressures lower than 500 mTorr. Therefore, additional time was required for each cycle of the chamber's cleaning process for the turbos to be spun down before cleaning and spun back up before the chamber could resume its normal operation. For this and other reasons, it would be beneficial for there to be RPS systems that are able to efficiently operate over a large range of impedances/gas pressures, and to be tuned based on the coil's impedance differentials resulting from wide changes in gas and/or pressure in near-real time.

SUMMARY OF THE INVENTION

This disclosure relates to systems and apparatuses for the cleaning of HDP CVD chambers, and more specifically, for remote plasma source (RPS) systems used for the generation and delivery of cleaning radicals to the interior of such chambers for the purposes of reacting with and removing materials deposited therein during the chambers' normal operation.

Embodiments of this invention provide for embodiments of small RPS systems which uses an RF frequency of approximately 13.56 MHz and an approximately 50-ohm load to generate plasma. The plasma so generated is used to disassociate an input gas, (e.g., $NF_3$, etc.) into charged and neutral species (F, $F_2$, N, $N_2$, $NF_x$, etc., electron ions and excited species). Unlike past RPS systems, the compact nature of RPS systems discussed herein may permit them to be installed in very close proximity (within approximately 12 inches) to the reactant species located in the target chamber, providing a significant increase in particle effectiveness, and corresponding decrease in cleaning time, enhancing overall productivity of the system in manufacturing of wafers.

To facilitate a form factor that permits the RPS system's plasma source to be located as close to the target chamber as possible, RPS systems taught herein may include embodiments in which the power supply for the RPS system is remote from its plasma source. By decoupling these two parts of the RPS system, the portions of the RPS system that actually generate the plasma in order to radicalize the gasses used for cleaning the chamber and delivering those cleaning gasses to the chamber (i.e., the plasma source), may be made small enough to be placed in very close proximity to the target chamber itself. Further, to be minimally-invasive to the design of known HPD chambers, RPS systems disclosed herein may be connected to the chamber utilizing an existing port on the underside of such chambers, for the radicalized gas to be delivered.

Additionally, disclosed RPS systems may include a match control system for matching the RF load in the conductive coil and may comprise one or more variable capacitors configured to be able to vary its capacitance and thereby balance the RF load in the coil across a range of impedance values, and therefore across a range of corresponding gas pressures. Such an RPS system may be configured to tune the RF signal being output by the variable capacitor(s) based on the impedance of the coil in near-real time so that the RF load in the coil may be balanced in near-real time. This ability to tune the RF load in the coil so that it may be balanced across a range of impedances and corresponding gas pressures may enable such RPS systems to operate more efficiently in more situations. Further, the ability for such tuning to be performed in near-real time may provide for additional advantages, including maintaining system efficiency in situations where the system would experience varying gas flows and pressures during the cleaning process.

The foregoing has outlined rather broadly certain aspects of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

The present invention is directed to improved methods and systems for, among other things, the generation of supply of radicalized gasses to the interior of HDP chambers for the purposes of removing the buildup of materials on the surfaces thereof that result as a byproduct of their operation. The configuration and use of the presently preferred embodiments of such RPS systems are discussed in detail below. It should be appreciated, however, that the present invention provides many applicable inventive concepts that can be embodied in a wide variety of contexts other than cleaning chambers. Accordingly, the specific embodiments discussed are merely illustrative of specific ways to make and use the invention, and do not limit the scope of the invention.

While the application of an inductively coupled conductive coil to form radicalized fluorine (F') and destruct over 95% of the gas is not unique, what is unique is utilizing a dramatically reduced physical plasma source size to enable the formation of F' within 6 inches of a chamber body.

Figure 1:
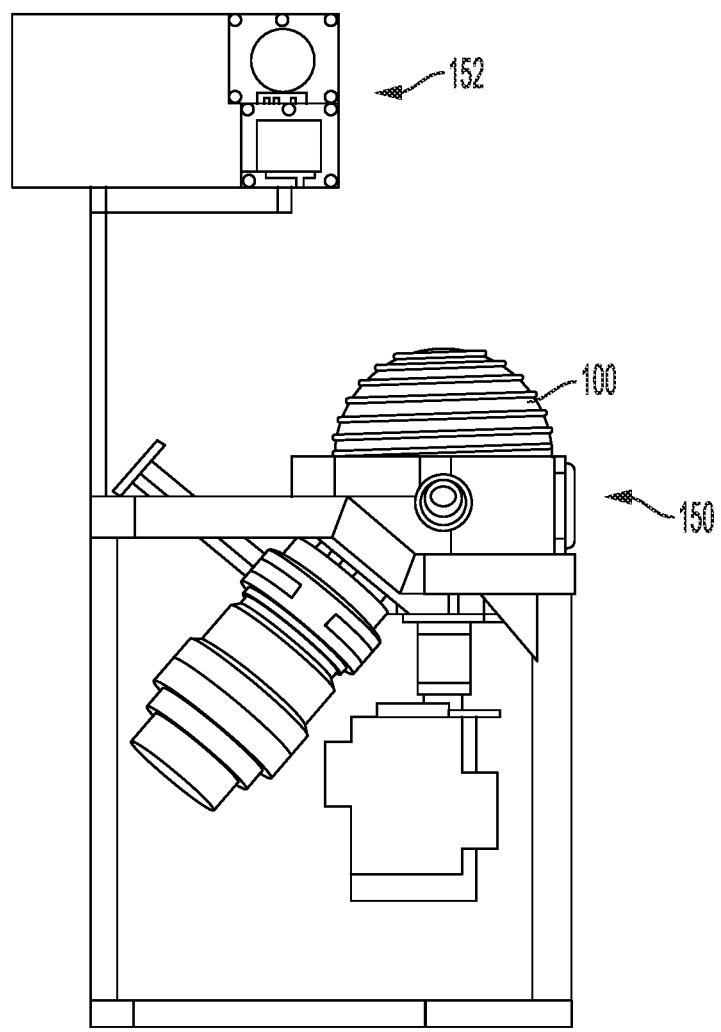
FIG. 1 shows a chamber with a known plasma generation system incorporated into the dome of the chamber.

Referring now to FIG. 1, FIG. 1 shows a HDP CVD chamber 150 with an integrated plasma generation system 100 and a central processing unit ("CPU") 152. The plasma generation system 100 of chamber 150 comprises a conductive coil that is integrated into the dome of chamber 150 itself. In chambers with integrated plasma generation systems such as chamber 150, gas is pumped into chamber 150 itself at which point plasma generation system 100 is activated and it destructs the input gas directly inside of chamber 150; however, this method of in situ cleaning gas generation via destruction of precursor gasses directly inside of chamber 150 yields only about an 80% gas destruction efficiency.

Figure 2:
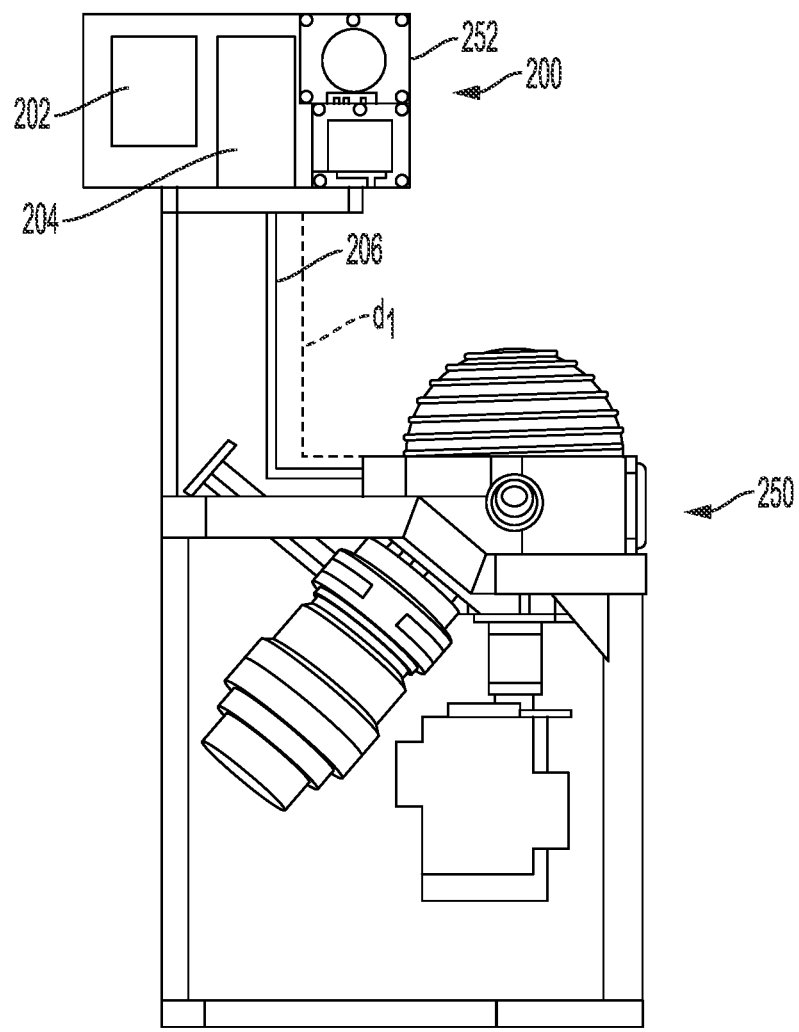
FIG. 2 shows a chamber with an example of a known RPS connected to it, wherein the RPS comprises an integrated power supply and is therefore configured such that its plasma source is relatively far removed from the chamber; and therefore, after the cleaning gas has been radicalized, it must travel a significant distance ($d_1$) through one or more tubes before it enters the chamber it is to clean.

FIG. 2 shows a chamber 250 with a conventional RPS system, RPS system 200, wherein known RPS system 200 comprises an integrated unit wherein its power supply 202 and plasma source 204 are combined in a single unit, which, in embodiments, may be collocated with CPU 252 of chamber 250, and is therefore configured such that its plasma source 204 is relatively far removed from chamber 250; and therefore, after the input gas has been radicalized, it must travel a distance d1 through one or more tubes 206 before it enters the chamber 250 that it is to clean.

In such known embodiments, the radicalized cleaning gasses generated by the RPS system must travel a significant distance ($d_1$) before they may encounter and react with the target species inside of the chamber, resulting in a reduction in their cleaning effectiveness.

This disclosure provides alternate embodiments of RPS system configured to reduce the distance between the plasma source, where the precursor gas is destructed into cleaning gases, and the interior of the chamber.

Figure 3:
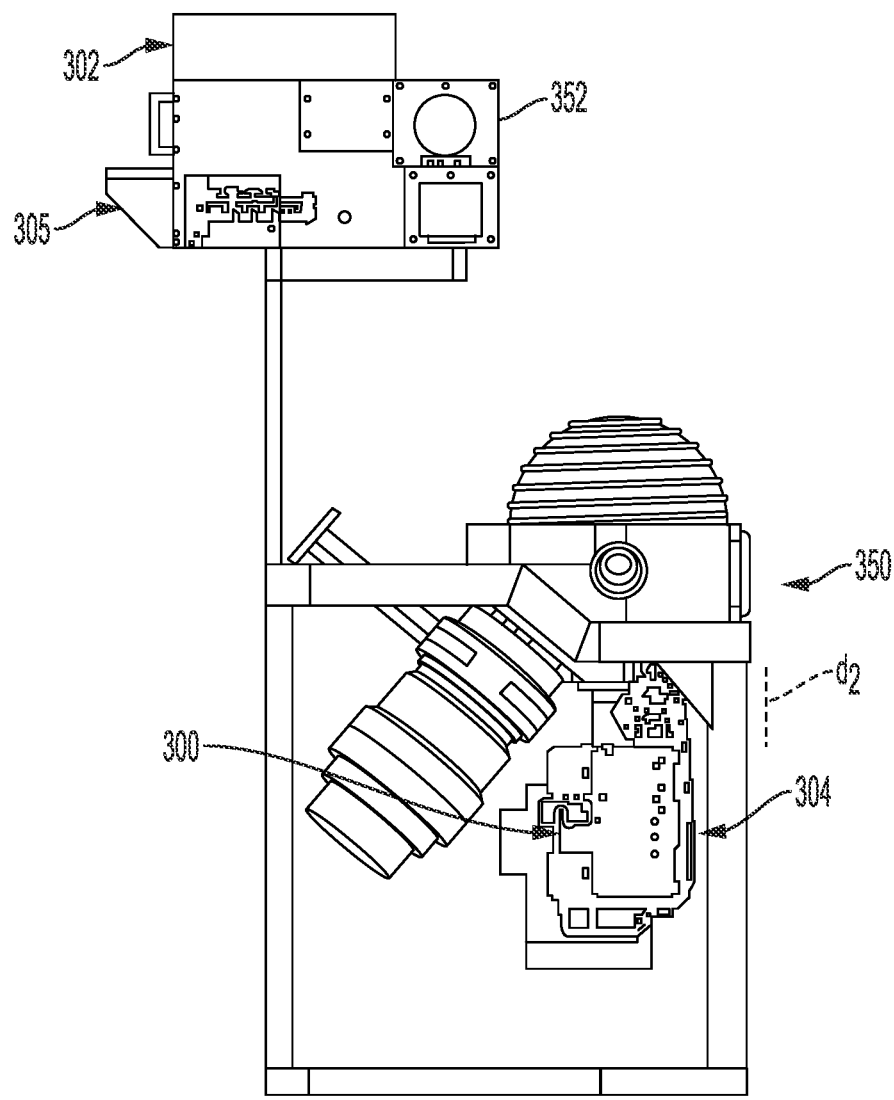
FIG. 3 provides an exemplary embodiment of an RPS system, as disclosed herein, shown attached to a HDP chamber wherein the power supply portion of the RPS system is separate from the portion of the RPS system that generates plasma and delivers radicalized gas to the chamber, resulting in the plasma source of the RPS system being sized such that it can be located relative to the chamber such that the radicalized gas that is generated by the RPS system need only travel through tube(s) a distance of $d_2$ before it enters the chamber.

FIG. 3 provides an exemplary embodiment of an RPS system as taught herein, RPS system 300, shown attached to chamber 350 wherein the power supply 302 of RPS system 300 is separate from the plasma source 304 that radicalizes a precursor gas and delivers a radicalized gas generated therefrom to chamber 350, resulting in plasma source 304 being sized such that it can be located in close proximity to chamber 350 so that the radicalized cleaning gases is generated by RPS system 300 at plasma source 304 need only travel the comparatively shorter distance of d2 before it enters chamber 350.

RPS system 300 may further comprise programmable logic controller ("PLC") 305 which may be used to control RPS system 300 as well as interface with software for chamber 350. PLC 305 may be configured to monitor signals from the chamber's CPU 352. In embodiments, including the one depicted in the associated Figure, PLC 305 may be located in a case adjacent to the chamber's CPU 352. PLC 305 may control process completion ("endpoint") signals as well as monitor other key signals from the chamber system which may be used to turn off and, on the RPS system as required by the chamber film accumulation clean requirement trigger event causing a clean to occur and finish. PLC 305 may provide instructions to perform functions during the process of cleaning chamber 350 such as locking the throttle valve during the cleaning process such that other signals generated by the existing chamber CPU 352 may be utilized for endpoint control. Signals such as chamber pressure or Peak to Peak RF Voltage (Vpp) may be utilized for this endpoint control if pressure is not being controlled, but rather locked the throttle valve once pressure has been set. Locking the pressure controlling throttle valve enables other signals, such as pressure or Vpp to be observed as increasing or decreasing and then stabilizing when there are no longer any remaining silicon-containing solid compounds being removed by being converted into a gas such as $SiF_4$.

The PLC of an RPS system, such as PLC 305, may additionally control the RPS system power level as well as monitoring signals from the main CPU to trigger the RPS system to turn on or off. Should monitored areas, such as reflected power or interlocks be triggered on the main chamber, the PLC may be configured to take additional actions responsive thereto, including but not limited to shutting down the RF power to the plasma source, placing the chamber into an interlock state, and enabling an operator to take corrective action. This ensures that additional wafers are prevented from running through the chamber while it is in a faulted state.

By making the power supply remote from the plasma source as well as utilizing a radio frequency of approximately 13.56 MHz and tuning the power signature of the coil, the efficiency of the radical fluorine generation approaches 100% and achieves this destruction close to the chamber source. This enables most of the F' to not recombine forming $F_2$ as it travels to the silicon accumulation in the chamber. Cleaning times and efficacy are improved, while the amount of $NF_3$ and other greenhouse gases released to the exhaust systems becomes negligible, even if detectable. This also enables the amount of RF energy deployed in the chamber to be reduced to just that required to keep the chamber warm and yet not enough energy to form $AlF_x$ on the ceramic dome, greatly increasing the life of the dome and dramatically increasing the time between opening the chamber for wet cleans.

When compared with RPS system 200 of FIG. 2, RPS system 300 of FIG. 3 is designed and configured such that while power supply 202 of the RPS system 200 must remain located in the same position as did the entire RPS system 200 of FIG. 2; however, plasma source 304 of RPS system 300 may be located and positioned immediately next to an inlet to the associated target chamber (chamber 350), while the plasma source 204 of RPS system 200 remains collocated with its power supply 202, at a location substantially further away from its chamber 250 than is plasma source 304 of RPS system 300 is from its chamber 350.

The present invention, as shown in the embodiment depicted in FIG. 3 as RPS system 300, may have plasma source 304 mounted underneath chamber 350, which may enable reduction of the distance that the radicalized cleaning gases must travel before they enter the chamber that they are to clean, from $d_1$ to $d_2$, which may provide for a materially increased effectiveness in the ability of those gasses to clean the chamber.

As it may be desirous to place the plasma source of the RPS system as close to the target chamber as possible, embodiments of RPS systems may be configured such that the form factor of the plasma source is small enough to be placed in immediate physical proximity with the chamber. One way to facilitate this small form size is to decouple the RPS system's power supply from its plasma source. By decoupling the power supply from the plasma source, the plasma source portion of the system may be made small enough to be positioned closer to the chamber than it may have been able to if the power supply portion of the system were not decoupled and located remote from the plasma source. For example, a plasma source may be mounted directly under the chamber so that the travel-path of the radicalized cleaning gasses from the plasma source to the chamber is as short as possible, while the power supply may be located across the room and connected to the plasma source by an RF cable or similar suitable means of RF power transmission.

The outlet of a plasma source of an RPS system may be attached to a chamber via an aluminum welded tube, angled precisely with a KF16 clamp attached to the bottom of the chamber and a KF40 clamp on the topside of the plasma source component of the RPS system.

Figure 4:
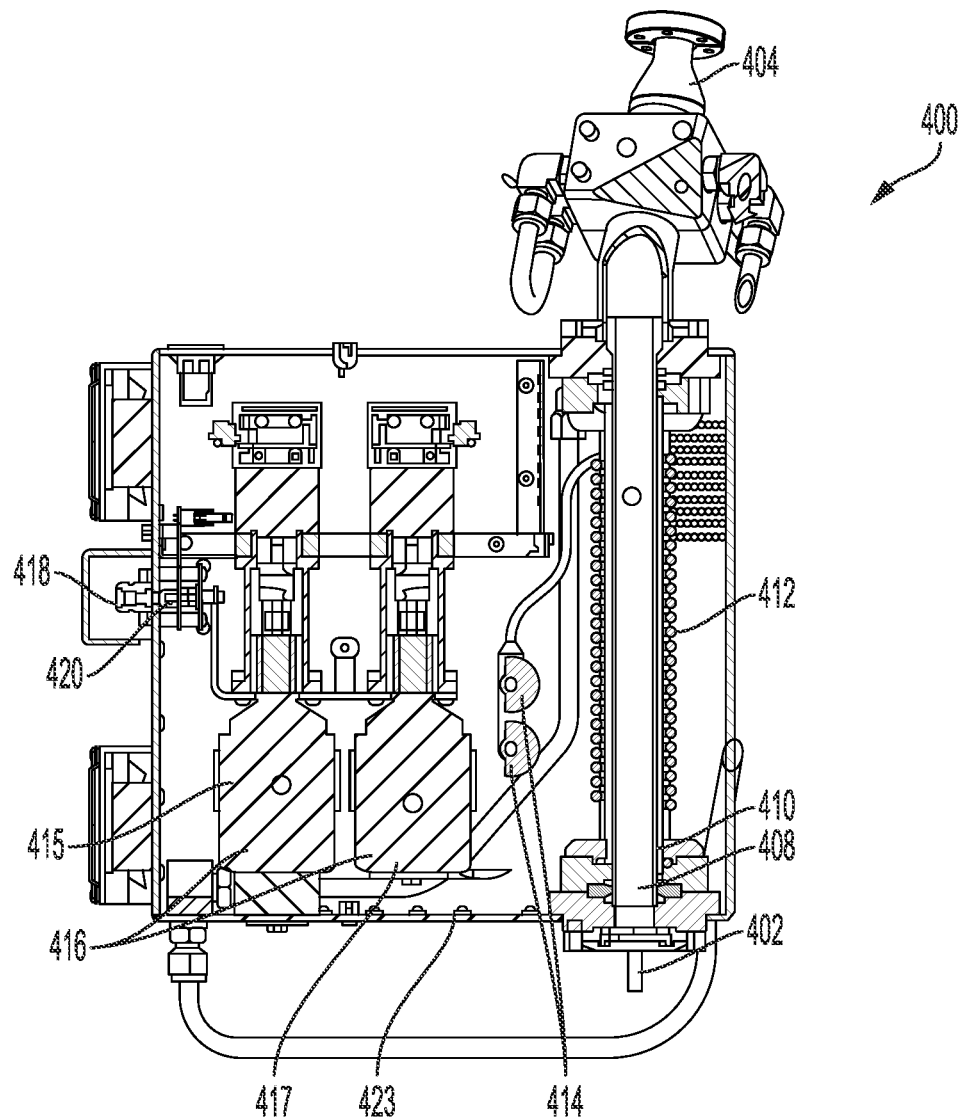
FIG. 4 provides a cross-sectional diagram of an exemplary embodiment of a plasma source of an RPS system as discussed herein.

FIG. 4 provides a cross-sectional diagram of an exemplary embodiment of the plasma source 400 an RPS system (such as RPS system 300 of FIG. 3), as disclosed herein. Plasma source 400 may comprise inlet 402 in fluid communication with outlet 404 via confinement tube 408, which may pass through conductive coil 412. A portion of confinement tube 408 may also pass inside of cooling sleeve 410, which runs through conductive coil 412 as well.

RF Input 418 may be configured to receive RF power from a power source that is remote from plasma source 400, such as power supply 302, and provide that RF power to capacitors 416. In embodiments, capacitors 416 may comprise a plurality of capacitors, and in particular embodiments capacitors 416 may comprise shunt capacitor 415 and tuning capacitor 417. Shunt capacitor 415 may be a variable capacitor, which may be connected to RF input 418 in parallel with tuning capacitor 417. Shunt capacitor 415 may be connected between RF input 418 and case ground 423 and may be configured to receive RF power from RF input 418 to transmit RF power so received to case ground 423 responsive to the system making a determination that there is an unbalanced load being generated in conductive coil 412. In certain embodiments, shunt capacitor 415 may comprise a capacitance of between approximately 10 and 500 picofarads. Tuning capacitor 417 may also be a variable capacitor and may be connected between RF input 418 and a first end of conductive coil 412 and may be configured to receive RF power from RF input 418 and to transmit RF power so received to conductive coil 412. Tuning capacitor 417 may be configured such that the capacitance of tuning capacitor 417 may be changed responsive to phase mag pickup 420 determining that there is an unbalance in the RF load being generated in conductive coil 412, to tune the RF power being passed through tuning capacitor 417 and into conductive coil 412 such that it balances the RF load in conductive coil 412. In certain embodiments, tuning capacitor 417 may comprise a capacitance of between approximately 10 and 250 picofarads.

One or more capacitors 414 may be connected between a second end of conductive coil 412 and case ground 423 and may be configured to receive RF power from conductive coil 412 and transmit RF power so received to case ground 432. In embodiments, capacitors 414 may consist of a single capacitor or multiple capacitors operating together. Capacitors 414 may comprise a fixed ground capacitor, and in embodiments may comprise a capacitance of between approximately 10 and 200 picofarads located between the end of the coil and case ground 423.

Phase mag pickup 420 may monitor a reflected RF signal, which is generated when the RF load in conductive coil 412 is unbalanced. The reflected RF signal may comprise reflected power, phase, and mag components, which may be used by the phase mag pickup 420 and/or match control system (shown as item 422 in FIG. 5) to determine an inductance of conductive coil 412 both iteratively, and in near-real time. Said inductance of coil 412 may be used by the system to determine a matching value required to balance the RF load in conductive coil 412 based on the impedance.

Figure 5:
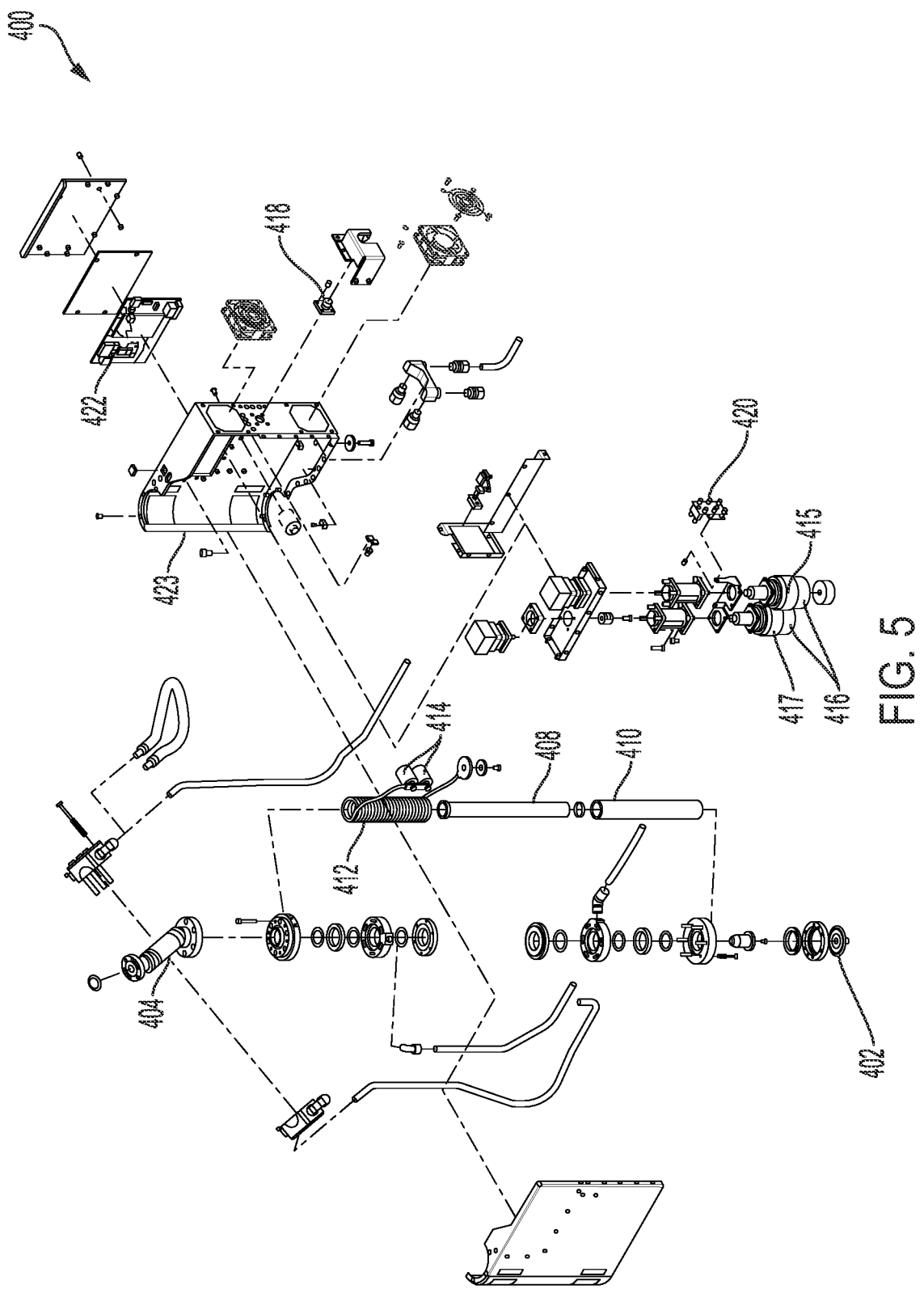
FIG. 5 shows an exploded view of an exemplary embodiment of a plasma source of an RPS system as discussed herein.

In embodiments one or more of capacitors 416 (i.e., shunt capacitor 415 and tuning capacitor 417) may comprise variable capacitors, which may allow for their capacitance, and therefore the load of the RF signal that they generate, to be actively controlled using phase mag pickup 420 which may be a component of a match control system, such as the match control system shown as item 422 in FIG. 5. In embodiments comprising such variable capacitors and wherein phase mag pickup 420 is configured to monitor the impedance of conductive coil 412, the match control system may determine a matching value, required to balance an RF load in conductive coil 412 based on the impedance of conductive coil 412, and instruct at least one of variable capacitors 416 to modify its capacitance based on the matching value in order to balance the RF load in conductive coil 412 and thereby optimize the efficiency of plasma generation across a range of coil impedance values, and therefore across a corresponding range of gas pressures. This RF balancing (or "tuning") using variable capacitor(s) may also enable enhanced balancing of RF load in the conductive coil to maximize the magnetic flux generated by the conductive coil using a coil that is longer than normal (e.g., between 17 and 25 turns). This in turn creates a longer mean free path of the ions in the plasma, and results in lower energy being required to destruct the input gas. This tuning process may be performed in near-real time, which may allow for the dynamic and precise operation of the RPS system across a range of gas pressures.

Embodiments of RPS systems, as taught herein, may operate as follows. An input gas may be received at inlet 402 and an input RF signal may be received at RF input 418. The gas travels through confinement tube 408 from inlet 402 to outlet 404. While the gas is traveling through confinement tube 408 one or more of capacitors 416 may receive RF power from RF input 418 and may output an RF signal into a first end of conductive coil 412. One or more of capacitors 416 may receive RF power from RF input 418 and may output an RF signal to case ground 423. Capacitors 414 may receive RF power from a second end of conductive coil 412 and may pass RF power so received to case ground 423. The magnetic flux induced in the center of conductive coil 412 responsive to a balanced RF load comprising a desired frequency being generated in conductive coil 412 generates plasma that destructs the input gas in confinement tube 408 passing therethrough, resulting in its disassociation into radicalized cleaning gases. After the input gas has been destructed by the plasma, the radicalized cleaning gas may continue traversing the remainder of confinement tube 408 and out of plasma source 400 and into a chamber via outlet 404.

Inductive plasma generation produces a large amount of heat and therefore the confinement tube of most RPS systems must be actively cooled using a coolant fluid (e.g., air, water, etc.) for the purposes of heat exchange. The use of water as a coolant fluid in electronics can be problematic as water is electrically conductive and can easily cause RF power to be shunted from plasma generation in the confinement tube to a parasitic state in the water if a path to ground via the water is available.

The primary portion of a plasma source of an RPS system which may be cooled to enhance and maximize the radical fluorine being produced by the system is the confinement tube, as inside of the confinement tube is the area where plasma is being generated, and where F' is being created and transported to the chamber. The confinement tube may be cooled by circulating water or another suitable cooling fluid between it and the cooling sleeve.

In embodiments, the outer wall of confinement tube 408 and the inner wall of cooling sleeve 410 may be spaced apart from one another such that a cooling fluid may be flowed through an aperture in cooling sleeve 410 and into the volume formed between confinement tube 408 and cooling sleeve 410. This may be done for cooling purposes. Additionally, one or both of confinement tube 408 and cooling sleeve 410 may comprise materials that enable the volume formed between confinement tube 408 and cooling sleeve 410, through which cooling fluid may be circulated, to be electrically insulated from materials outside of that volume. To facilitate this, in embodiments one or more of confinement tube 408 and cooling sleeve 410 may comprise ceramic or plastic. The electrical insulation of said volume may be further facilitated through, for example, the use of non-conductive (e.g., rubber) gaskets between the confinement tube and the cooling sleeve.

FIG. 5 shows an exploded view of the exemplary embodiment of plasma source 400 shown in FIG. 4. The exploded view provided in FIG. 5 shows in greater detail how the various components of plasma source 400 may be arranged and assembled relative to each other, in accordance with certain embodiments.

Additionally, FIG. 5 shows how plasma source 400 may further comprise match control system 422, which may include phase mag pickup 420. Match control system 422 may be configured to determine the impedance of conductive coil 412, and to calculate a matching value for tuning a capacitance of one or more of variable capacitors 416 such that the resulting RF signal being received by conductive coil 412 via said variable capacitor(s) 416 balances the RF load in conductive coil 412 in near-real time. Match control system 422 may be configured to send commands to one or more of shunt capacitor 415 and tuning capacitor 417 to change its/their capacitance based on the matching value in order for the RF load being generated in conductive coil 412 the system to remain balanced to an approximately 50-ohm load at approximately 13.56 mHz.

Figure 6:
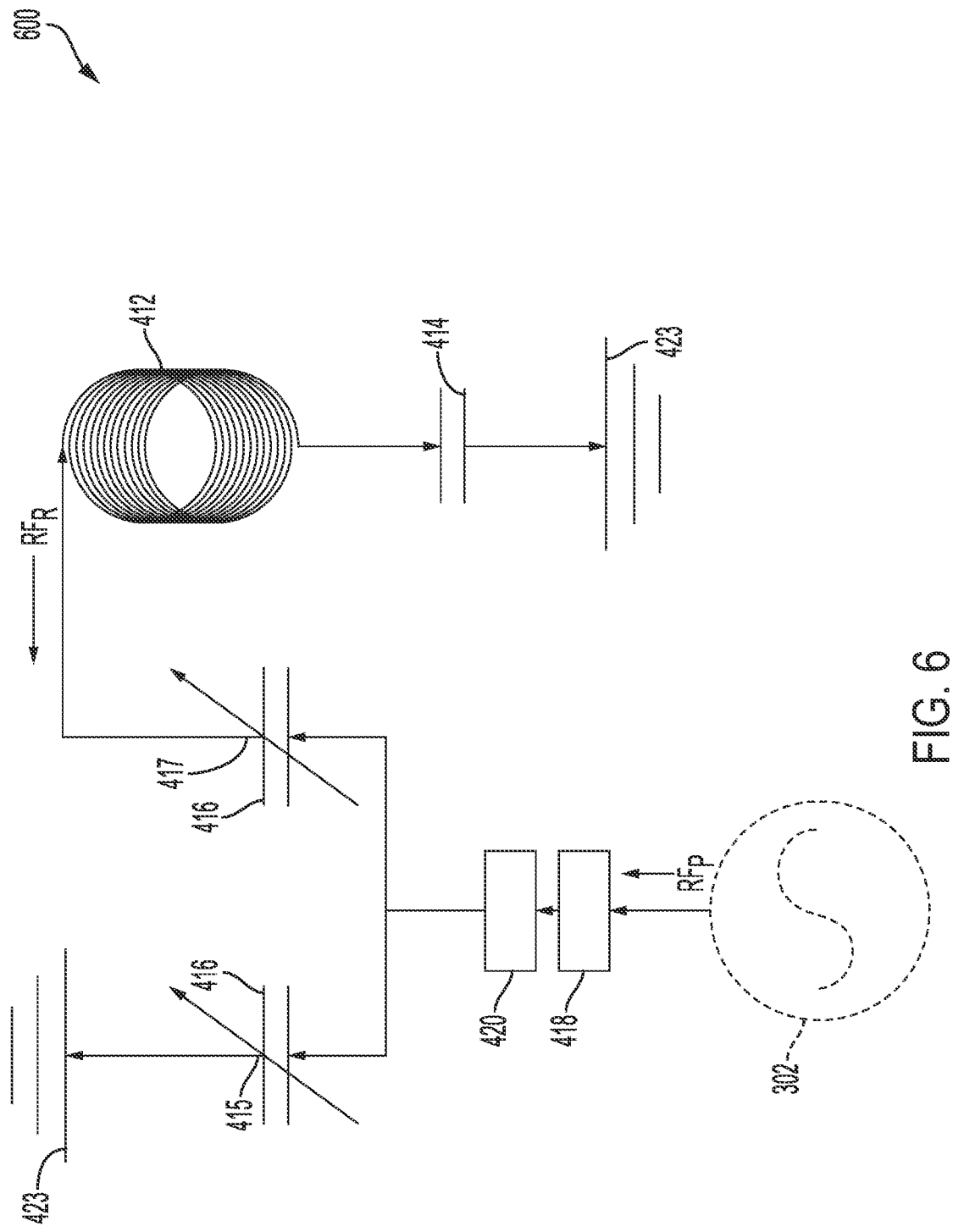
FIG. 6 displays a schematic showing an exemplary RF signal path through an embodiment of a plasma source.

FIG. 6 displays a schematic showing exemplary RF signal path 600 through exemplary embodiment of a plasma source 400. In such an embodiment, RF input 418 may receive RF power ("$RF_P$" in FIG. 6) from a 13.56 MHz RF generator, such as, for example, power supply 302 of FIG. 3. The RF power may then move from RF input 418 and be split between capacitors 416. Shunt capacitor 415 may transmit the signal that it receives to case ground 423, while tuning capacitor 417 may transmit a signal to a first end of conductive coil 412.

Phase mag pickup 420, may be connected between RF input 418 and capacitors 416 and may be configured to receive and monitor a reflected RF signal ("$RF_R$" in FIG. 6), which may be automatically generated in the system when the RF load in conductive coil 412 is unbalanced. The reflected RF signal may comprise power, phase, and mag components, and may be used by match control system 422 to calculate one or more matching values which may be used to tune one or more of variable capacitors 416, (i.e., shunt capacitor 415 and tune capacitor 417) to balance the RF load in the coil. Match control system 422 may then transmit instructions to one or more of variable capacitors 416 to change its/their capacitance value based on the matching value. Such tuning of the plasma source may be performed by the match control system 422 in near-real time.

Figure 7:
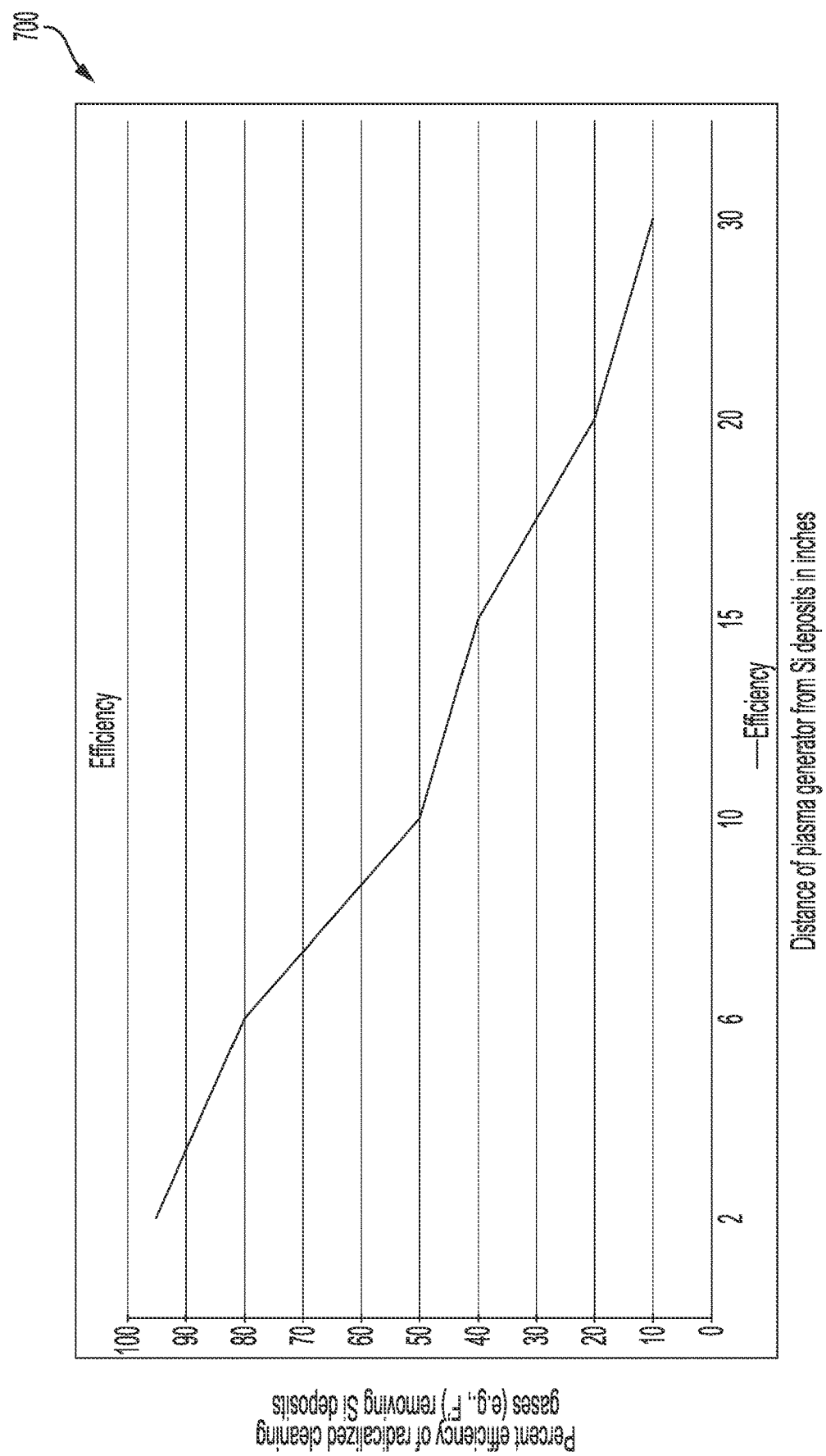
FIG. 7 displays a graph showing the percentage of a radicalized cleaning gas' efficacy of removing Si deposits versus the distance of its generation from the Si deposits.

FIG. 7 displays a graph showing the percentage of a radicalized cleaning gas' (e.g., F') efficiency of removing Si deposits versus the distance in inches of its generation from the Si deposits. In graph 700 the y-axis is the cleaning gas' percent efficiency of removing Si deposits, while the x-axis is the distance of the gas' radicalization by means of plasma (i.e., the location of the RPS system's plasma source) from the Si deposits in inches. Graph 700 shows, and has been discussed previously, the efficacy of a radicalized cleaning gas quickly drops with the distance that it must travel before reaching the deposits that it is to clean. This is caused by F' reconstituting to its inert state of $F_2$ without the presence of plasma or elements with which the radicalized fluorine may combine. This rapid drop-off of the generated cleaning gas' efficacy over distance traveled demonstrates the significance of the impact that minimizing the distance between the plasma source and the chamber can have on the efficiency of the cleaning process.

While the present system and method has been disclosed according to the preferred embodiment of the invention, those of ordinary skill in the art will understand that other embodiments have also been enabled. Even though the foregoing discussion has focused on particular embodiments, it is understood that other configurations are contemplated. In particular, even though the expressions "in one embodiment" or "in another embodiment" are used herein, these phrases are meant to generally reference embodiment possibilities and are not intended to limit the invention to those particular embodiment configurations. These terms may reference the same or different embodiments, and unless indicated otherwise, are combinable into aggregate embodiments. The terms "a", "an" and "the" mean "one or more" unless expressly specified otherwise. The term "connected" means "communicatively connected" unless otherwise defined.

When a single embodiment is described herein, it will be readily apparent that more than one embodiment may be used in place of a single embodiment. Similarly, where more than one embodiment is described herein, it will be readily apparent that a single embodiment may be substituted for that one device.

Considering the wide variety of methods for cleaning chamber known in the art, the detailed embodiments are intended to be illustrative only and should not be taken as limiting the scope of the invention. Rather, what is claimed as the invention is all such modifications as may come within the spirit and scope of the following claims and equivalents thereto.

None of the descriptions in this specification should be read as implying that any particular element, step, or function is an essential element which must be included in the claim scope. The scope of the patented subject matter is defined only by the allowed claims and their equivalents. Unless explicitly recited, other aspects of the present invention as described in this specification do not limit the scope of the claims.

To aid the Patent Office and any readers of any patent issued on this application in interpreting the claims appended hereto, the applicant wishes to note that it does not intend any of the appended claims or claim elements to invoke 35 U.S.C. 112(f) unless the words "means for" or "step for" are explicitly used in the particular claim.

The invention claimed is:

1. A plasma source for an RPS system, comprising:
   1.1. a conductive coil;
   1.2. an inlet configured to receive a gas;
   1.3. an outlet configured to transmit radicalized cleaning gases to a reaction chamber;
   1.4. a confinement tube placing the inlet and the outlet in fluid communication, and which passes through the conductive coil therebetween;
   1.5. an RF input configured to receive RF power;
   1.6. a variable capacitor electrically connected to the RF input and to a first end of the conductive coil, the variable capacitor configured to receive RF power form the RF input and to output an RF signal to the conductive coil;
   1.7. a capacitor electrically connected to the RF input and to a second end of the conductive coil and to ground; and
   1.8. a match control system comprising a phase mag pickup, and configured to:
      1.8.1. monitor an impedance of the conductive coil in near-real time;
      1.8.2. determine a matching value calculated to balance an RF load in the conductive coil generated by the RF signal at a desired frequency based on the impedance; and
      1.8.3. modify a capacitance of the variable capacitor based on the matching value.

2. The plasma source of claim 1, wherein the RF load is approximately 50 ohms, and wherein the desired frequency is approximately 13.56 mHz.

3. The plasma source of claim 1, wherein the outlet is further configured to connect to a chamber and wherein a distance from the center of the conductive coil to an end of the outlet is less than 10 inches.

4. The plasma source of claim 1, wherein said system further comprises: a power source configured to operate in a location remote from the plasma source and to generate and supply RF power to the RF input via a suitable means of power transmission.

5. The plasma source of claim 1, further comprising: a cooling sleeve disposed about a length of the confinement tube and inside of the conductive coil, wherein an outer surface of the confinement tube and an inner surface of the cooling sleeve define a volume through which a cooling fluid may be circulated.

6. The plasma source of claim 5, wherein at least one of confinement tube and the cooling sleeve comprise an electrical insulator, and wherein the volume is electrically insulated from materials outside of the volume.

7. The plasma source of claim 1, wherein the phase mag pickup is configured to monitor the impedance of the conductive coil in near-real time via a reflected RF signal.

8. The plasma source of claim 1, wherein the conductive coil comprises between 17 and 25 turns.

9. The plasma source of claim 1, wherein the capacitor comprises a fixed capacitor comprising a capacitance between approximately 10 and 200 picofarads.

10. The plasma source of claim 1, wherein the variable capacitor comprises a capacitance that may be varied between approximately 10 and 500 picofarads and is connected between RF input and ground.

11. The plasma source of claim 1, further comprising a second variable capacitor comprising a capacitance that may be varied between approximately 10 and 200 picofarads, electrically connected to the RF input and to the first end of the conductive coil.

12. An RPS system plasma source comprising:
  12.1. an RF input configured to receive RF power;
  12.2. an inductively coupled coil;
  12.3. a variable shunt capacitor electrically connected between the RF input and case ground, and configured to transmit received RF power to case ground;
  12.4. a variable tuning capacitor electrically connected between the RF input and a first end of the inductively coupled coil, and configured to transmit received RF power to said first end of the inductively coupled coil;
  12.5. a fixed capacitor electrically connected between a second end of the inductively coupled coil and case ground, and configured to transmit RF power received from the inductively coupled coil to case ground; and
  12.6. a match control system configured to balance an RF load in the inductively coupled coil at a desired frequency in in near-real time by monitoring a reflected RF signal, and to control a capacitance of at least one of the variable shunt capacitor and the variable tuning capacitor based on one or more tuning values calculated from the reflected RF signal.

13. The RPS system plasma source of claim 12, wherein the RF load comprises approximately 50 ohms, and the desired frequency comprises approximately 13.56 mHZ.

14. The RPS system plasma source of claim 12, further comprising an RF power supply configured to be located remotely from the RPS system plasma source and to generate and supply RF power to the RF input.

15. The RPS system plasma source of claim 12, wherein the RPS system plasma source is sized and configured such that an outlet of the RPS system plasma source is within 10 inches of the bottom of a HDP CVD chamber.

16. The RPS system plasma source of claim 12, further comprising:
  16.1. an inlet for receiving an input gas;
  16.2. an outlet for transmission of radicalized cleaning gases from the plasma generation system to a chamber;
  16.3. a confinement tube placing the inlet and the outlet in fluid communication, and passing through the inductively coupled coil between the inlet and the outlet; and
  16.4. a cooling sleeve disposed inside of the inductively coupled coil and surrounding a length of the confinement tube, the cooling sleeve configured to receive a cooling fluid in a volume between the cooling sleeve and the confinement tube.

17. The RPS system plasma source of claim 16, wherein the volume is electrically insulated from components of the plasma generation system located outside of the volume.

18. A method of dynamically tuning an RF load in a coil of an RPS system plasma source comprising an RF input, a conductive coil, and a variable capacitor electrically connected therebetween, the method comprising the steps of:
  18.1. receiving RF power at the RF input;
  18.2. inputting an RF signal into the conductive coil through the variable capacitor;
  18.3. measuring an impedance of the conductive coil based on reflected RF power;
  18.4. determining a matching value required to balance an RF load in the conductive coil based on the impedance;
  18.5. tuning a capacitance of the variable capacitor based on the matching value; and
  18.6. inputting the RF signal into the conductive coil through the tuned variable capacitor.

19. The method of claim 18, wherein a RF load of substantially 50 ohms at a frequency of substantially 13.56 mHz is generated in the conductive coil responsive to step 18.7.

20. The method of claim 18, wherein steps 18.3-18.6 are iterated in near-real time.

* * * * *